United States Patent
Baars et al.

(10) Patent No.: US 10,103,067 B1
(45) Date of Patent: Oct. 16, 2018

(54) SEMICONDUCTOR DEVICE COMPRISING TRENCH ISOLATION

(71) Applicant: GLOBALFOUNDRIES Inc., Grand Cayman (KY)

(72) Inventors: Peter Baars, Dresden (DE); Gunter Grasshoff, Radebeul (DE); Rico Hueselitz, Goeda (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/617,388

(22) Filed: Jun. 8, 2017

(51) Int. Cl.
| | |
|---|---|
| *H01L 21/76* | (2006.01) |
| *H01L 21/84* | (2006.01) |
| *H01L 21/762* | (2006.01) |
| *H01L 21/311* | (2006.01) |
| *H01L 29/78* | (2006.01) |
| *H01L 21/02* | (2006.01) |
| *H01L 29/161* | (2006.01) |
| *H01L 21/8238* | (2006.01) |

(52) U.S. Cl.
CPC .......... *H01L 21/84* (2013.01); *H01L 21/0217* (2013.01); *H01L 21/31111* (2013.01); *H01L 21/31144* (2013.01); *H01L 21/76283* (2013.01); *H01L 21/823878* (2013.01); *H01L 29/161* (2013.01); *H01L 29/7847* (2013.01)

(58) Field of Classification Search
None
See application file for complete search history.

(56) References Cited

U.S. PATENT DOCUMENTS 6,914,338 B1 * 7/2005 Liaw ................. H01L 21/84
  257/516
9,202,864 B2 * 12/2015 Cai .................. H01L 21/76232

* cited by examiner

*Primary Examiner* — Jack Chen
(74) *Attorney, Agent, or Firm* — Amerson Law Firm, PLLC (57) ABSTRACT

A method of manufacturing a trench isolation of a semiconductor device is provided including providing a silicon-on-insulator (SOI) substrate comprising a semiconductor bulk substrate, a buried oxide layer formed on the semiconductor bulk substrate and a semiconductor layer formed on the buried oxide layer, forming a trench through the semiconductor layer and extending at least partially into the buried oxide layer, forming a liner at sidewalls of the trench, deepening the trench into the semiconductor bulk substrate, filling the deepened trench with a flowable dielectric material, and performing an anneal of the flowable dielectric material.

20 Claims, 9 Drawing Sheets

SEMICONDUCTOR DEVICE COMPRISING TRENCH ISOLATION

BACKGROUND

1. Field of the Disclosure

Generally, the present disclosure relates to the field of integrated circuits and semiconductor devices, and, more particularly, to the manufacture of semiconductor devices comprising trench isolation structures for isolating active devices formed on SOI substrates.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of n-channel transistors and p-channel transistors are formed on a substrate including a crystalline semiconductor layer. Individual active devices, such as FETs, are electrically isolated from each other by means of trench isolations, in particular, shallow trench isolation (STI) structures. Conventionally, the formation of STI structures involves forming trenches in a layer of silicon and then filling the trenches with silicon oxide. Alternatively, the trenches can be lined with a silicon oxide liner formed by a thermal oxidation process and then filled with additional silicon oxide or another material, such as polysilicon. The thus filled trenches define the size and placement of the active regions of a wafer.

In the course of aggressive downscaling, for example, in the context of sub 22 nm Very Large Scale Integrated (VLSI) Circuits CMOS technologies, the formation of STIs, particularly, in FDSOI (Fully Depleted Silicon-on-Insulator) substrates, becomes more and more a crucial issue. The involved aspect ratios, for example, in the context of SRAM manufacturing, require new STI filling procedures as compared to manufacturing of semiconductor devices on above 22 nm platforms. Recently, spin-on-glass or flowable oxides, rather than conventional silicon oxide materials, have been used for filling STIs. The flowable oxides "flow" during deposition to properly fill voids. However, filling STIs with flowable oxides requires a steam anneal that attacks the FDSOI substrate, i.e., the thin Si layer or cSiGe channel regions are oxidized. In particular, in SRAM areas where the active region is very small, any loss by oxidation cannot be tolerated.

In view of the situation described above, the present disclosure provides a technique of forming a semiconductor device comprising an STI. The technique can be integrated within (FD)SOI technologies and allows for the formation of a FET with intact channel region. Moreover, the disclosure provides a semiconductor device comprising an STI.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the manufacturing of a semiconductor device, for example, an FDSOI semiconductor device, comprising an STI. Due to the particular manufacturing technique disclosed herein, the formation of the STI can be integrated in the process flow of FDSOI FET manufacturing.

A method of manufacturing a trench isolation of a semiconductor device is provided that includes providing a silicon-on-insulator (SOI) substrate comprising a semiconductor bulk substrate, a buried oxide layer formed on the semiconductor bulk substrate and a semiconductor layer formed on the buried oxide layer, forming a trench through the semiconductor layer and extending at least partially into the buried oxide layer, forming a liner at sidewalls of the trench, deepening the trench into the semiconductor bulk substrate, filling the deepened trench with a flowable dielectric material, and performing an anneal (that may comprise a steam anneal) of the flowable dielectric material. A portion of the annealed flowable dielectric material may be removed from an upper portion of the trench and the upper portion of the trench may then be filled with an oxide material. The liner protects the semiconductor layer at the inside of the trench during the (steam) anneal. The bottom of the trench formed through the semiconductor layer may be positioned with the buried oxide layer or (already before the further deepening) within the semiconductor bulk substrate.

Moreover, a method of manufacturing a trench isolation of a semiconductor device is provided, including providing a silicon-on-insulator (SOI) substrate comprising a semiconductor bulk substrate, a buried oxide layer formed on the semiconductor bulk substrate and a semiconductor layer formed on the buried oxide layer, forming a trench through the semiconductor layer and extending at least partially into the buried oxide layer, deepening the trench into the semiconductor bulk substrate, subsequently forming a liner at sidewalls of the deepened trench, filling the deepened trench with a flowable dielectric material, and performing an anneal (that may comprise a steam anneal) of the flowable dielectric material.

Further, a method of manufacturing a semiconductor device is provided, including providing a silicon-on-insulator (SOI) substrate comprising a semiconductor bulk substrate, a buried oxide layer formed on the semiconductor bulk substrate and a semiconductor layer formed on the buried oxide layer, wherein the semiconductor layer comprises a (compressive strain) SiGe region, forming a first trench through the semiconductor layer and extending at least partially into the buried oxide layer, forming a second trench spaced apart from the first trench through the semiconductor layer and extending at least partially into the buried oxide layer such that one sidewall of the second trench exposes a side surface of the SiGe region, forming a first liner at sidewalls of the first trench and a second liner at sidewalls of the second trench, deepening the first trench into the semiconductor bulk substrate without deepening the second trench, filling the deepened first trench and the second trench with a flowable dielectric material, performing an anneal (that may comprise a steam anneal) of the flowable dielectric material, and forming an n-channel transistor and a p-channel transistor separated from each other by the second trench and wherein the SiGe region provides a channel region of the p-channel transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Herein, methods of manufacturing semiconductor devices with STIs are disclosed. The STIs are formed by forming trenches in an SOI substrate. Sidewalls of the trenches are covered by a liner. The trenches are filled with a flowable dielectric material. The flowable dielectric material is subjected to a steam anneal. During the steam anneal, the liner covers and protects a semiconductor layer comprising an SiGe region against the steam anneal. The STIs comprise relatively deep trenches and a relatively shallow trench. The flowable dielectric material may be removed from lower portions of the relatively deep trenches and completely removed from the relatively shallow trench. The removed flowable dielectric material is replaced by some conventional oxide material. After completion of the STIs, n-channel transistors may be formed in an n-FET area of the SOI substrate and p-channel transistors may be formed in a p-FET area of the SOI substrate, wherein the p-FET area is separated and electrically insulated from the n-FET area by a relatively shallow trench.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of semiconductor devices. These references are intended to be used in a manner consistent with the drawings only for teaching purposes, and are not intended as absolute references for semiconductor device structures. For example, FETs or memory devices may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

Generally, manufacturing techniques and semiconductor devices in which n-channel transistors and/or p-channel transistors and memory cells may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices and CMOS integrated circuit devices. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure generally provides techniques for the formation of a semiconductor device comprising an STI. Formation of the STI can be integrated in the process flow of the formation of FETs, for example, n-channel and p-channel FETs. The FETs may be planar Fully Depleted FETS. The FETs may be (Fully Depleted) FinFETS. The disclosed techniques may be suitably used in manufacturing of semiconductor devices on below 22 nm platforms, for example, 12 nm platforms designed for manufacture of FDSOI devices.

In the following, a process flow for manufacturing a semiconductor device comprising a dual STI configuration, for example, that can be readily integrated into the process flow of the manufacture of both n-channel and p-channel transistor devices is described with reference to FIGS. 1a-1j.

Figure 1A:
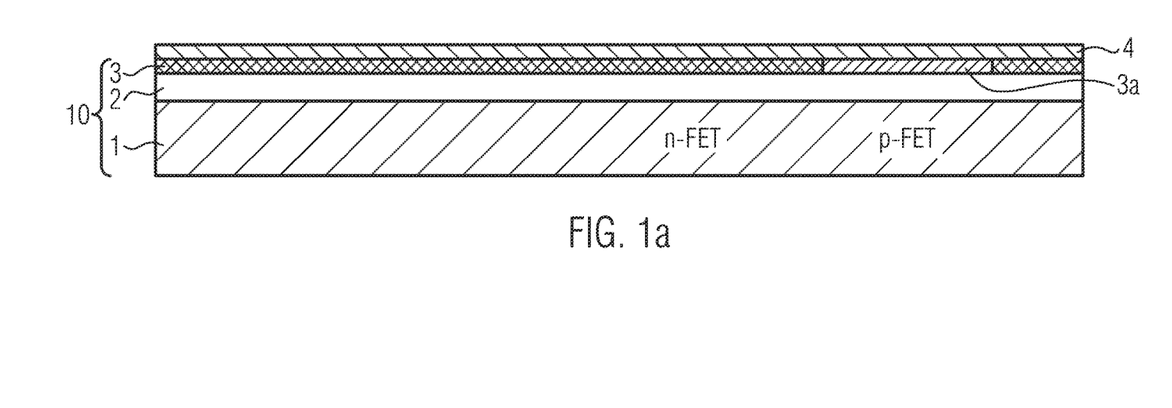
FIGS. 1a-1j illustrate an exemplary process flow of manufacturing a semiconductor device comprising the formation of an STI according to an example of the present disclosure.

FIG. 1a shows an SOI (silicon-on-insulator) substrate 10 used for the formation of a semiconductor device, for example, comprising FETs. The SOI substrate 10 may be a fully depleted (FD) SOI substrate suitable for the formation of FDSOI transistors. The SOI substrate 10 comprises a semiconductor bulk substrate 1, a buried oxide (BOX) layer 2 formed on the semiconductor bulk substrate 1 and a semiconductor layer 3 formed on the BOX layer 2. The semiconductor layer 3 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like.

The BOX layer 2 of the SOI substrate 10 may comprise silicon dioxide or a borosilicate glass or a borophosphosilicate glass (BPSG). The BOX layer 2 may be composed of different layers and one of the different layers may comprise BPSG or an $SiO_2$-compound comprising boron or phosphorus. For example, the thickness of the semiconductor layer 3 may be in the range of 5-20 nm, in particular, 5-10 nm, and the thickness of the BOX layer 2 may be in the range of 10-50 nm, in particular, 10-30 nm and, more particularly, 15-25 nm.

The semiconductor bulk substrate 1 may comprise or consist of silicon, in particular, single crystal silicon. Other materials can be used to form the semiconductor bulk substrate such as, for example, germanium, silicon germanium, gallium phosphate, gallium arsenide, etc. In particular, the semiconductor bulk substrate 1 may be P-type or N-type doped.

Further, one may define for the SOI substrate 10 an n-FET area provided for the manufacture of an n-channel FET and a p-FET area provided for the manufacture of a p-channel FET. In the p-FET area, an SiGe channel 3a is formed in the semiconductor layer 3. For example, a compressive strained silicon-germanium channel (cSiGe) region 3a is formed in the semiconductor layer 3 of the SOI substrate 10 by local Ge enrichment involving the epitaxial formation of a compressive SiGe layer on the exposed surface of the semiconductor layer 3. The compressive silicon-germanium channel 3a is provided in order to enhance the mobility of charge carriers in the channel region of a p-channel FET that is to be formed in the p-FET area. It is noted that, particularly in the context of the 22 nm technology, epitaxy is supplemented by a condensation anneal that drives the Ge atoms into the SOI channel and oxidizes the epitaxial SiGe at the same time.

As shown in FIG. 1a, an oxide layer 4, for example, consisting of or comprising $SiO_2$, is formed on the SOI substrate 10, i.e., on top of the semiconductor layer 3 and thereby on top of the SiGe region 3a.

Figure 1B:
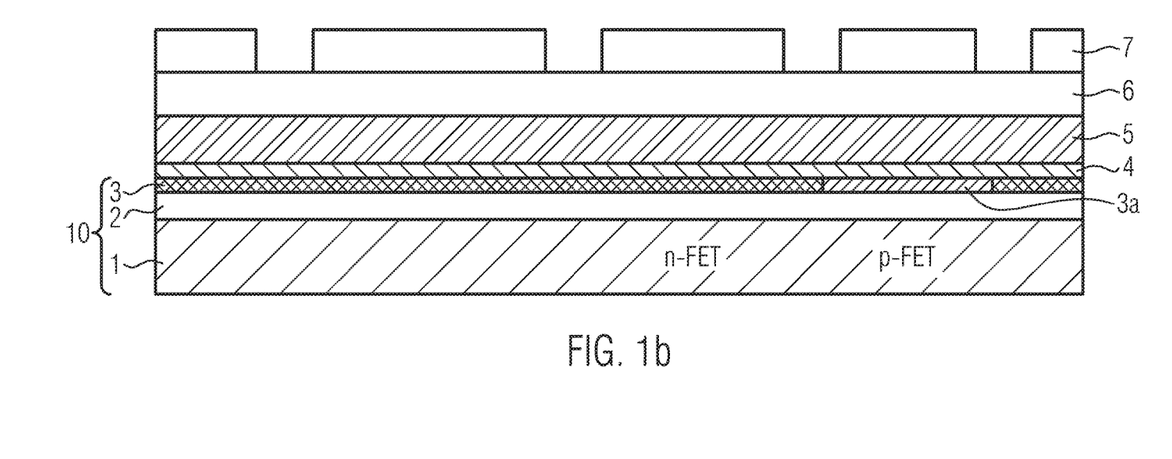

According to one embodiment, a lithography-etch-lithography-etch process (LELE) is performed in the course of the formation of an STI. As shown in FIG. 1b, a layer 5 is formed on the oxide layer 4 and a mask layer 6 is formed on the layer 5. The layer 5 may comprise or consist of a silicon-nitride material and it will be used as a planarization stop layer in the further procedure (see below). For example, the layer 5 may be made of $Si_3N_4$, SiON or silicon carbide or a combination thereof, and it may have a thickness of about 30-70 nm. The layer 5 may be formed by chemical vapor deposition, plasma enhanced chemical vapor deposition or low pressure chemical vapor deposition.

Figure 1C:
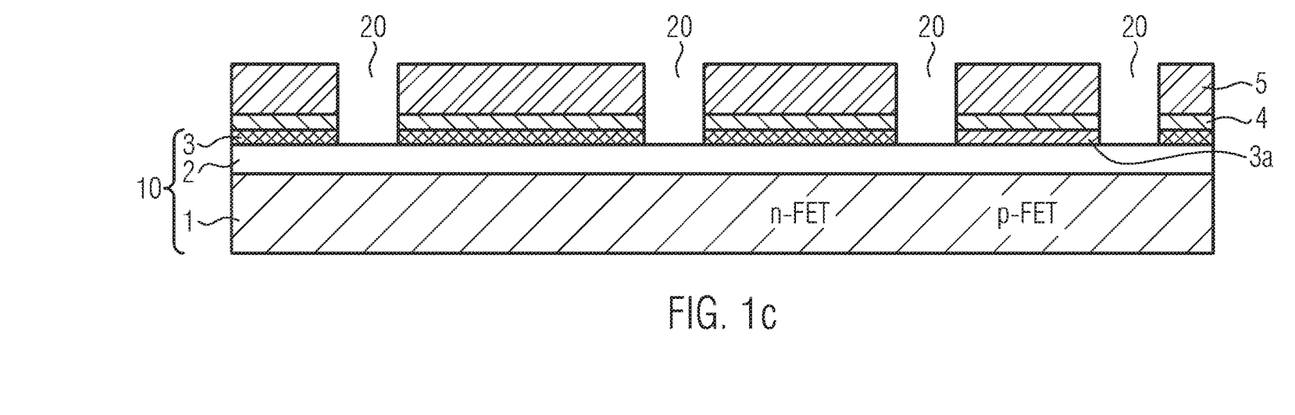

The mask layer 6 may comprise or consist of a spin-on-hard mask (SOH) material and SiON. Further, a lithography mask layer 7 is formed on the second mask layer 6. The lithography mask layer 7 may comprise a bottom anti-reflective coating (BARC) formed on top of the mask layer 6 and a photoresist layer formed on the BARC. The LELE approach (that may include an additional "memory layer," for example, an oxide layer, formed on top of the SOH—SiON stack) is known in the art and, therefore, is not described here in detail. FIG. 1c shows the resulting configuration after etching, resist strip and removal of the second mask layer 6. Trenches 20 are formed that partially reach into the BOX layer 2 of the SOI substrate 10 but do not reach to the semiconductor bulk substrate 1 of the SOI substrate 10 in this example. The trenches 20 may have depths in the range of about 20-50 nm and widths in a range of about 20-100 nm.

Figure 1D:
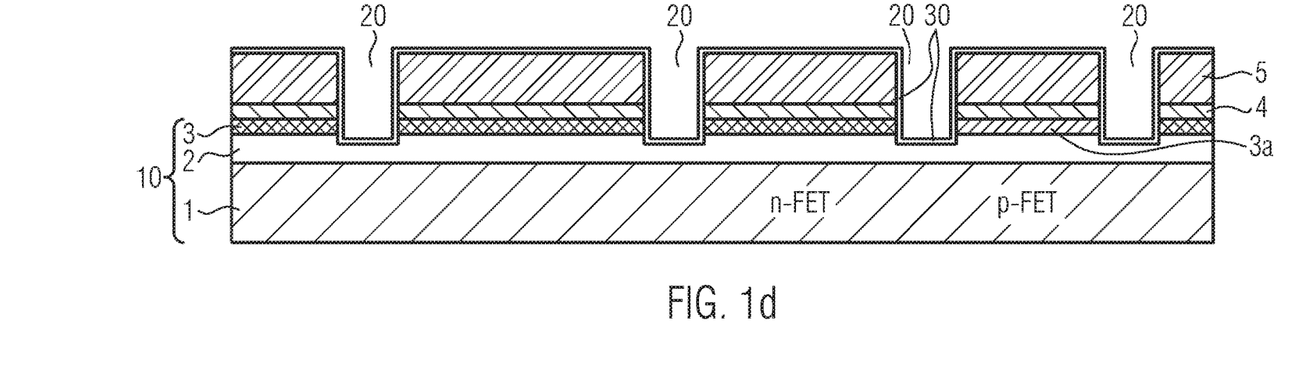

Next, a liner 30 is formed at the bottom and sidewalls of the trenches 20 (see FIG. 1d). The liner 30 is provided in order to protect the semiconductor layer 3, in particular, the SiGe region 3a, during the further procedure. Moreover, the liner 30 encapsulates the BOX layer 2. For example, the liner 30 may be formed of or comprise a nitride material, such as $Si_3N_4$ or SiON, and it may have a thickness of about 2-8 nm. The liner 30 may be formed by plasma enhanced chemical vapor deposition or low pressure chemical vapor deposition.

Figure 1E:
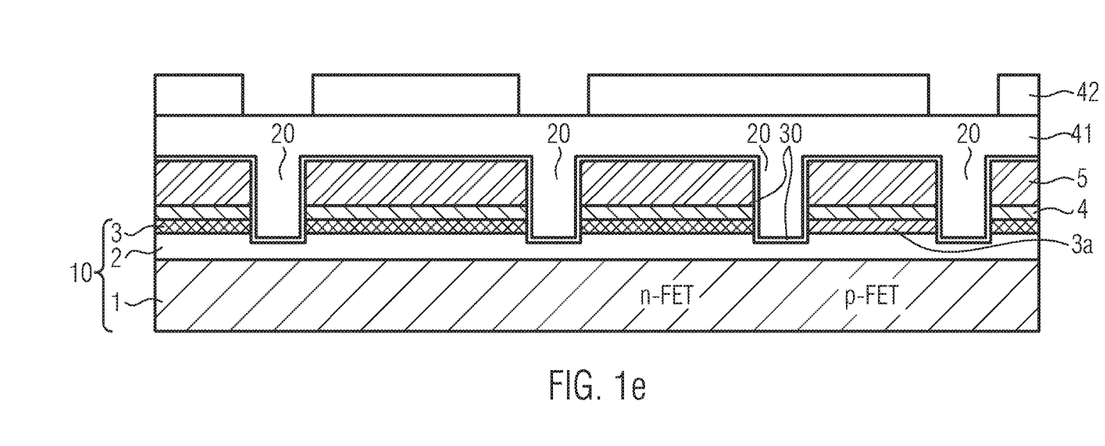

In the manufacturing step illustrated in FIG. 1e, another mask layer 41 is formed over the structure illustrated in FIG. 1d. The mask layer 41 may comprise a spin-on-hard mask (SOH) material and an SiON cap layer. Another lithography mask layer 42 is formed on the mask layer 41 and it may comprise another BARC and another photoresist layer formed on that BARC. The lithography mask layer 42 is structured to facilitate the formation of deep trenches (see FIG. 1f). The mask layer 41 is patterned by means of the patterned lithography mask layer 42 and used as an etching mask for forming the deep trenches, for example, by anisotropic etching, in order not to attack the liner 20 laterally.

Figure 1F:
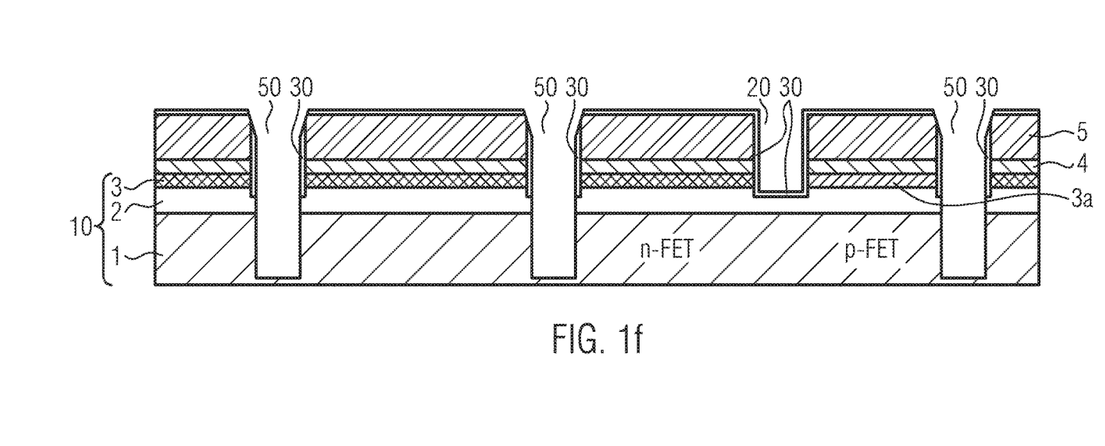

After etching, resist strip and removal of the mask layer 41, the configuration illustrated in Figure if results. Deep trenches 50 are formed at the edges of the n-FET and p-FET areas and the deep trenches 50 reach deep into the semiconductor bulk substrate 1 of the SOI substrate 10. The aspect ratio (ration of trench depth to trench width) may be larger than 7 or larger than 10. As shown in FIG. 1*f*, the liner 30 has not been attacked during removal of the mask layer 41 (due to selective etching) and, therefore, the liner 30 still covers the SiGe region 3*a* and semiconductor layer 3 within the deep trenches 50 and the shallow trench 20 that is formed between the n-FET area and the p-FET region and not deepened further.

Figure 1G:
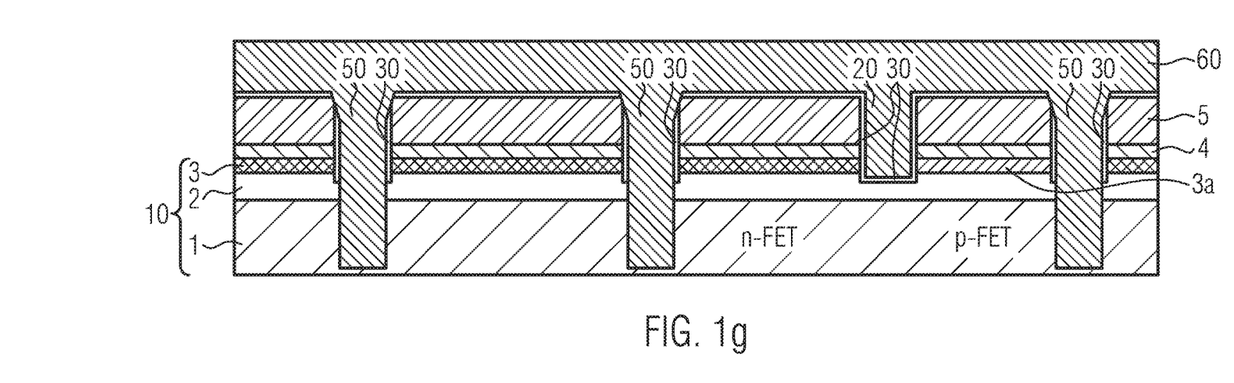

Next, a flowable dielectric material 60 is formed in the deep trenches 50 as well as the shallow trench 20 (see FIG. 1*g*). The flowable dielectric material 60 is, for example, a flowable oxide material that may comprise silicon oxide or SiONH and may be formed by flowable chemical vapor deposition (FCVD). At the moment of deposition, the flowable dielectric material 60 has fluid characteristics similar to spin-on-glass films and, therefore, it shows excellent gap filling capability. The flowable dielectric material 60 may be formed by using a spin-on dielectric (SOD) formation process, or by depositing a flowable dielectric by a chemical vapor deposition (CVD) process, such as radical-component CVD.

Various chemistries can be added to silicon-containing precursors in order to allow the deposited film to flow. In some embodiments, nitrogen hydride bonds are added. Examples of flowable dielectric precursors, particularly flowable silicon oxide precursors, include a silicate, a siloxane, methyl SilsesQuioxane (MSQ), hydrogen SisesQuioxane (HSQ), MSQ/HSQ, perhydrosilazane (TCPS), perhydro-polysilazane (PSZ), tetraethyl orthosilicate (TEOS), or silyl-amine, such as trisilylamine (TSA).

The flowable dielectric material 60 may be deposited using a silicon-containing precursor to react with another precursor, such as a "radical-nitrogen" precursor generated by a plasma. In some examples, the silicon-containing precursor is carbon-free and includes silyl-amines, such as $H_2N(SiH_3)$, $HN(SiH_3)2$, $N(SiH_3)_3$, or a combination thereof. The silyl-amines may be mixed with additional gases that may act as carrier gases, reactive gases, or both. Examples of the additional gases may include $H_2$, $N_2$, $NH_3$, He and Ar, among other gases. Silyl-amines may also be mixed with other carbon-free silicon-containing gas(es), such as silane ($SiH_4$) and disilane ($Si_2H_6$), hydrogen (e.g., $H_2$), and/or nitrogen (for example, $N_2$, $NH_3$).

Nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture comprising a combination of $NH_3$, $N_2$ and $H_2$.

The flowable dielectric material 60 may be deposited at a temperature in a range from about 40-200° C. The deposition pressure may be in a range of about 100 mTorr to about 10 Torr. In some examples, the reaction source uses a gaseous environment containing trisilylamine $Si_3H_9N$ and $NH_3$ with flow rates in the range of about 100-1000 sccm, and of about 100-2000 sccm, respectively.

After deposition of the flowable dielectric material 60, a steam anneal is performed either in the same process chamber used for the deposition of the flowable dielectric material 60 or in another process chamber. The steam anneal results in shrinking and densification of the insulation material 60. The steam anneal may be performed for some minutes to some hours and a temperature of some hundred ° C., for example. The anneal process may be performed at a temperature in a range of about 150-800° C. According to one example, the anneal process may start at about 150° C. and ramps up the temperature gradually to a predetermined temperature of about 500-800° C. The pressure of the anneal process may be in a range of about 500-800 Torr. The flow rate of steam may be in a range of about 1-20 slm (standard-liter per meter). The duration of the steam thermal anneal process may, particularly, be in a range from about 20 minutes to about 2 hours. Moreover, a steam anneal may be performed during the deposition process in order to provide for seam healing due to the formation of additional hydroxyl groups, for example.

Steam anneal may be followed by additional thermal anneal at a temperature in range of 200-1200° C., for example, for further densification and/or (partial) conversion of the insulating material to SiO or $SiO_2$, for example. The additional thermal anneal may be an $N_2$ dry (without steam) anneal for better oxide quality purposes. An inert gas, such as $N_2$, Ar or He, may be used during the dry thermal anneal process and a peak anneal temperature of the dry anneal in a range of about 1000-1200° C. may be selected. The pressure of the thermal anneal may be in a range of about 500-800 Torr. The duration of the dry thermal anneal process may be in a range of about 30 minutes to about 3 hours. During the steam anneal and the subsequently performed thermal anneal, the semiconductor layer 3 and the SiGe region 3*a* are protected by the liner 30.

Figure 1H:
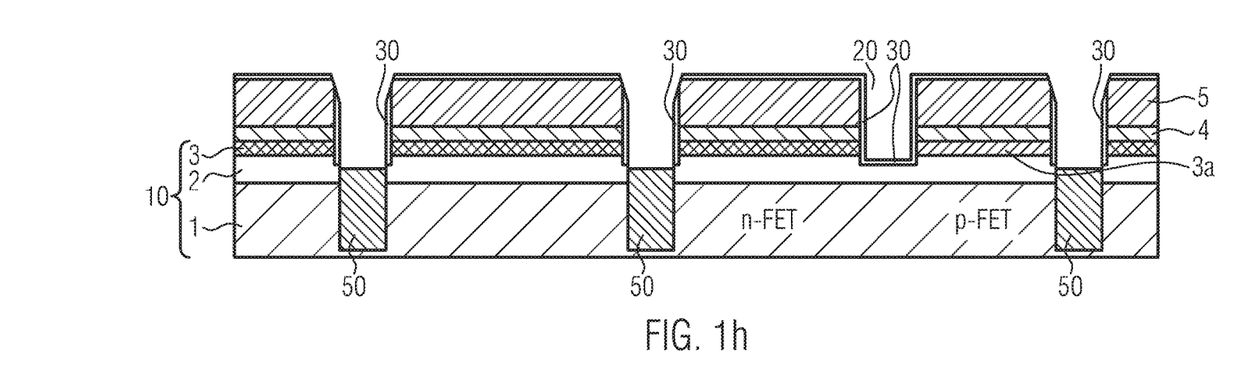

Excessive flowable dielectric material 60 formed on the (planarization stop) layer 5 and over the trenches 20 and 50 is removed, for example, by chemical mechanical polishing. During the chemical mechanical polishing process, the layer 5 serves as a planarization stop layer. Subsequently, the flowable dielectric material 60 formed in the shallow trench 20 is removed and the top portions of the flowable dielectric material 60 formed in the deep trenches 50 are also removed, for example, by means of dry etching. The flowable dielectric material 60 may be partially removed from the deep trenches 50 to a level below the level of the semiconductor layer 3 and SiGe region 3*a* by highly selective (with respect to the material of the liner 30) anisotropic etching. In other words, the liner 30 is exposed during the removal of flowable dielectric material 60. The resulting structure is shown in FIG. 1*h*.

Figure 1I:
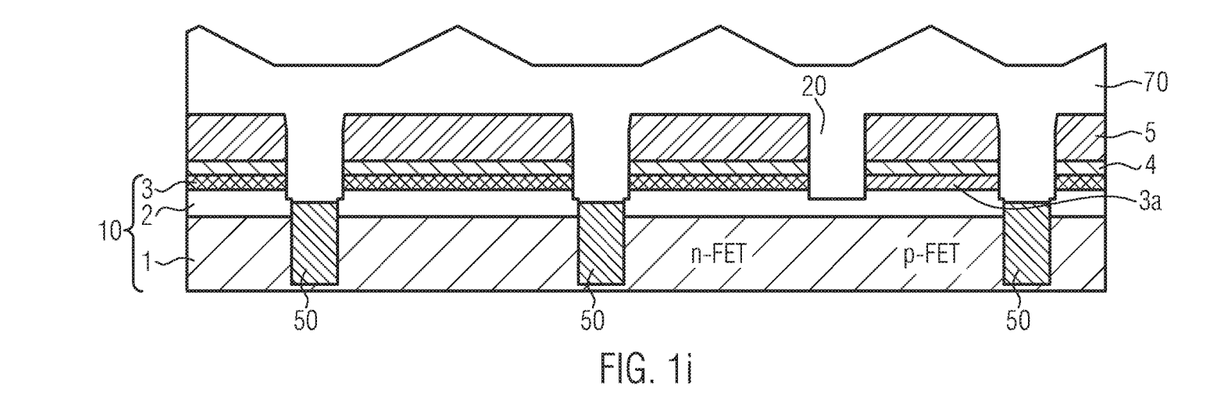

Subsequently, the liner 30 is removed and an oxide material 70 is filled into the top portions of the deep trenches 50 (from which the flowable dielectric material 60 has been removed) and the shallow trench 20 as illustrated in FIG. 1*i*. The liner 30 may be removed using an appropriate wet chemistry like hot phosphorous acid or by means of an isotropic nitride etch, for example. The oxide material 70 is not a flowable dielectric material and it may be a high-density plasma oxide formed by high-density plasma chemical vapor deposition and it may comprise a silicon oxide. In particular, the oxide material 70 may be the same as the material of the BOX layer 2 of the SOI substrate 10. At this step of the process flow, the constraints of the aspect ratio are relaxed (since the lower portions of the deep trenches are already filled with the flowable dielectric material 60) and proper filling is, thus, no longer a crucial issue.

Figure 1J:
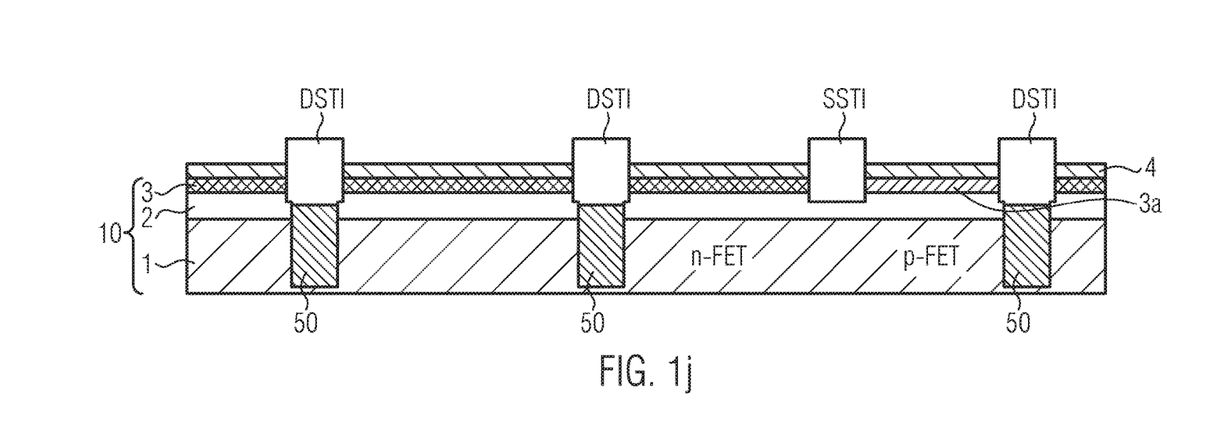

As a next step, the oxide material 70 is planarized, for example, by chemical mechanical polishing, and the planarization stop layer 5 is removed. As a result and as shown in FIG. 1*j*, the p-FET area 3*a* is separated from the n-FET area by the shallow STI (SSTI) and further electrical isolation is properly provided by the deep STIs (DSTI). After formation of the STIs is completed, p-channel FETs may be formed in the p-FET area and n-channel FETs may be formed in the n-FET area.

Whereas in the process flow illustrated in FIGS. 1*a*-1*j* the shallow trenches 20 extend to some level below the upper surface of the BOX layer 2 of the SOI substrate 10 and above the surface of the semiconductor bulk substrate 1 of the SOI substrate 10 only, i.e., they extend partially into the BOX layer 2, (see FIGS. 1*c*-1*e*, for example), according to other examples, the shallow trenches 20 may extend to a level below the surface of the semiconductor bulk substrate 1 of the SOI substrate 10, i.e., the shallow trenches 20 extend into the semiconductor bulk substrate 1.

Another exemplary process flow is illustrated in FIGS. 2*a*-2*h*. As compared to the process flow shown in FIGS. 1*a*-1*j*, liner deposition in the trenches is performed after formation of the deep trenches. In the process flow illustrated in FIGS. 1*a*-1*j*, the liner 30 is not present in the deep trenches 50 and, thus, more space to be filled is available. However, according to the approach illustrated in FIGS. 2*a*-2*h*, the manufacturing process for the protection of the SiGe/Si channel region may be improved.

Figure 2A:
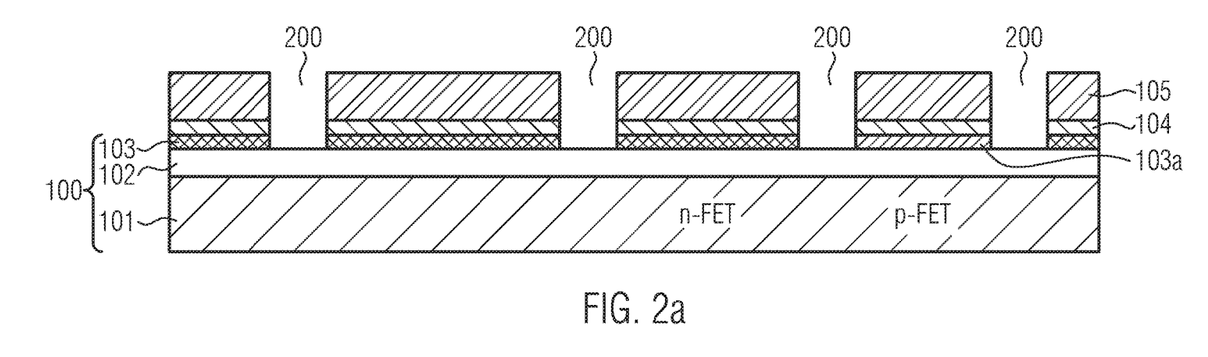
FIGS. 2a-2h illustrate another exemplary process flow of manufacturing a semiconductor device comprising the formation of an STI according to an example of the present disclosure.

FIG. 2*a* shows a similar state as the one shown in FIG. 1*c* of the process flow that was described above. An SOI substrate 100 is provided comprising a semiconductor bulk substrate 101, a BOX layer 102 formed on the semiconductor bulk substrate 101 and a semiconductor layer 103 formed on the BOX layer 102 and comprising an SiGe region 103*a* in a p-FET area. An oxide layer 104 is formed on the semiconductor layer 103 and the SiGe region 103*a* and a layer 105 is formed on the oxide layer 104. The layer 105 may comprise or consist of a nitride material (for example, $Si_3N_4$ or SiON). Trenches 200 are formed through the layer 105 and the oxide layer 104 and through the semiconductor layer 103 and the SiGe region 103*a*. In the shown example, the trenches partially extend into the BOX layer 102 of the SOI substrate 100. According to an alternative example, the trenches 200 reach the semiconductor bulk substrate 201 and partially extend into the same. The trenches 200 may be formed by an LELE procedure as described above with reference to FIG. 1*b*.

Figure 2B:
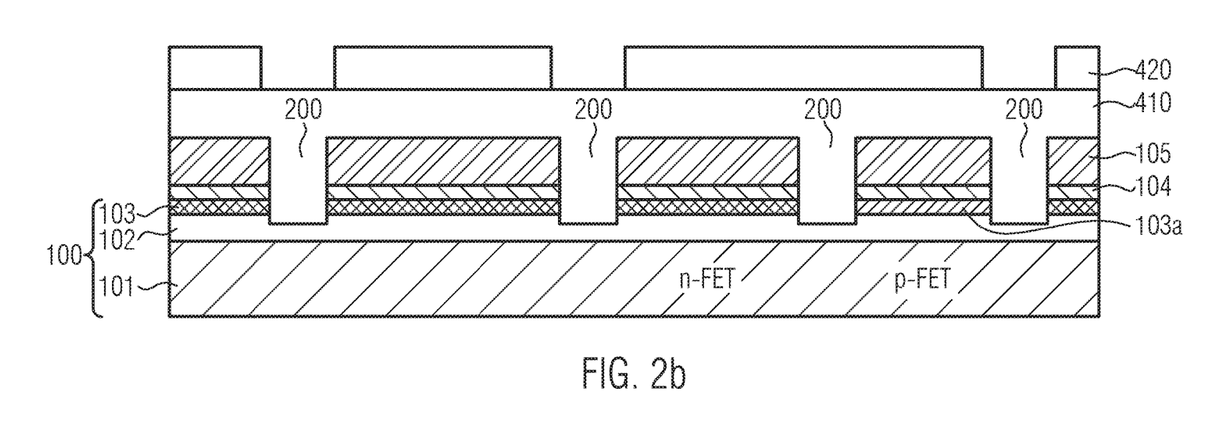
Figure 2C:
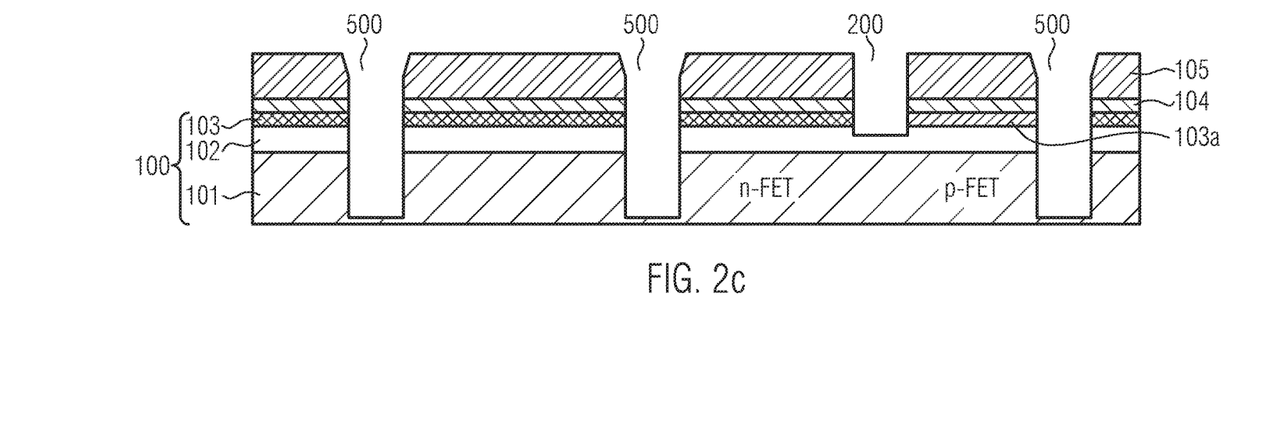

A hard mask 410 is formed over the structure shown in FIG. 2*a* and a patterned lithography mask 420 is formed on the hard mask 410 (see FIG. 2*b*). The hard mask 410 may comprise a spin-on-hard mask (SOH) material and an SiON cap layer. After being patterned, the hard mask 410 can be used as an etching mask in order to form deep trenches 500 as shown in FIG. 2*c*. The trenches 200 and 500 may have dimensions and aspect ratios as described above with reference to FIGS. 1*c* and 1*f*.

Figure 2D:
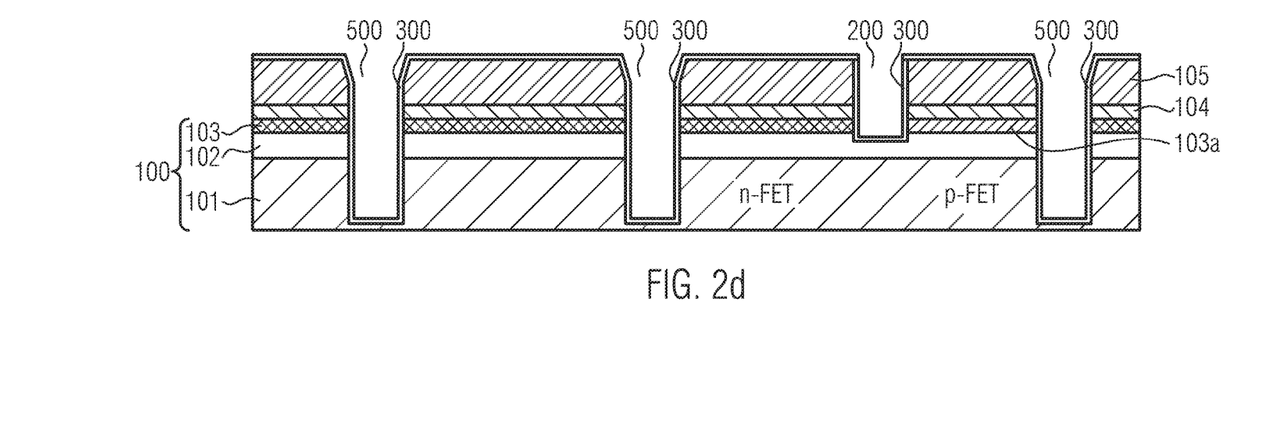
Figure 2E:
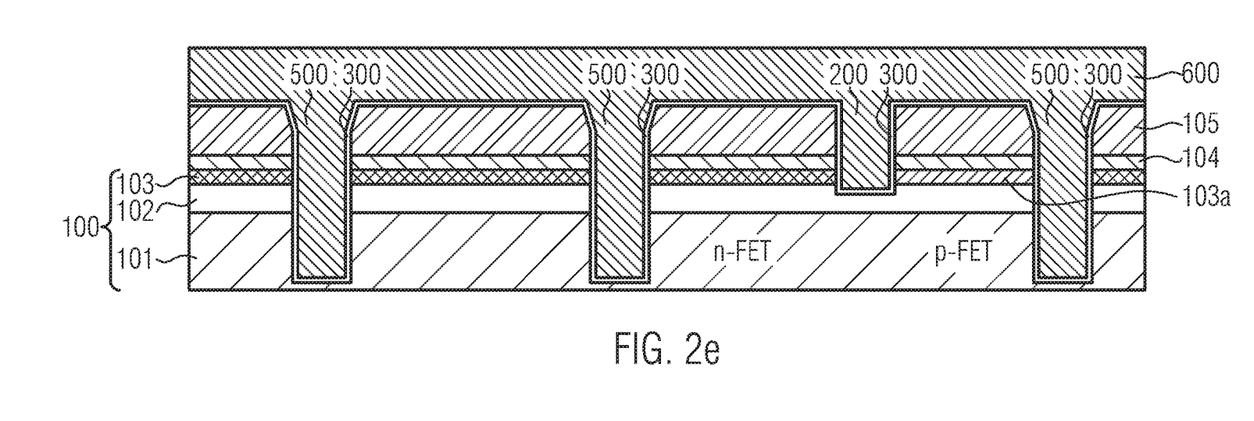

A liner 300 is formed in the trenches 200 and 500 (see FIG. 2*d*). The liner 300 may comprise or be made of a nitride material. Different from the process flow illustrated in FIGS. 1*a*-1*j*, the liner 300 covers the entire sidewalls and the bottom of the deep trenches 500 before filling the deep trenches with a flowable dielectric material 600, as shown in FIG. 2*e*. The flowable dielectric material 600 is formed in the deep trenches 500 as well as the shallow trench 200 (see FIG. 2*e*). The flowable dielectric material 600 may be a flowable oxide material, for example, comprising silicon oxide or SiONH, and may be formed by flowable chemical vapor deposition (FCVD). The flowable dielectric material 600 may be formed as described above with reference to FIG. 1*g*.

Figure 2F:
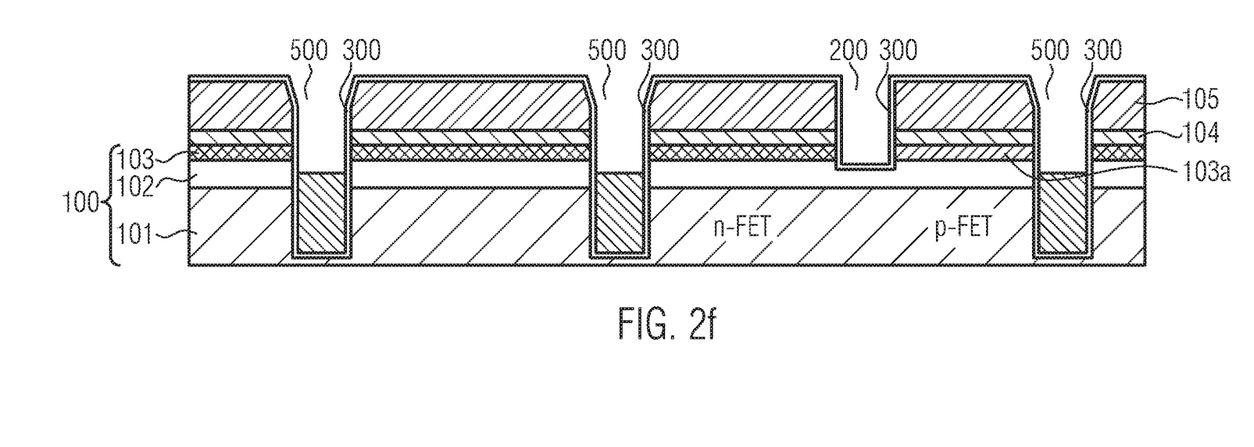

Excessive flowable dielectric material 600 formed on the (planarization stop) layer 105 and over the trenches 200 and 500 is removed, for example, by chemical mechanical polishing. Subsequently, the flowable dielectric material 600 formed in the shallow trench 200 is removed and the top portions of the flowable dielectric material 600 formed in the deep trenches 500 are also removed, for example, by means of dry etching. The flowable dielectric material 600 may be partially removed from the deep trenches 500 to a level below the level of the semiconductor layer 103 and SiGe region 103*a*. The resulting structure is shown in FIG. 2*f*.

Figure 2G:
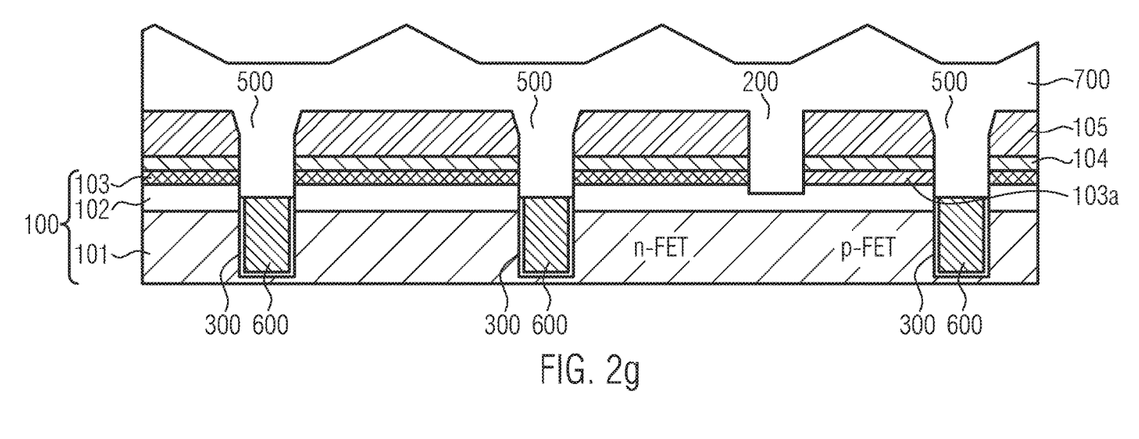

Subsequently, the portions of the liner 300 formed in the top portions of the deep trenches 500 and in the shallow trench 200, respectively, are removed, for example, using wet chemistry or by means of an isotropic reactive ion etching (ME) etch. The lower portions of the liner 300 covered by the remaining portions of the flowable dielectric material 600 remain in place. An oxide material 700 is filled into the top portions of the deep trenches 500 (from which the flowable dielectric material 600 has been removed) and the shallow trench 200, as illustrated in FIG. 2*g*. The oxide material 700 may be a high-density plasma oxide formed by high-density plasma chemical vapor deposition and it may comprise a silicon oxide. In particular, the oxide material 700 may be the same as the material of the BOX layer 102 of the SOI substrate 100.

Figure 2H:
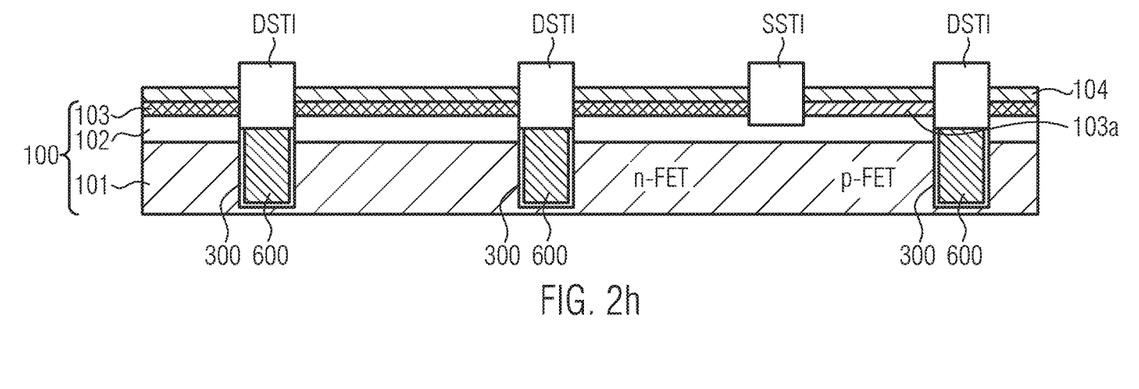

As a next step, the oxide material 700 is planarized, for example, by chemical mechanical polishing, and the planarization stop layer 105 is removed. As a result and as shown in FIG. 2*h*, the p-FET area is separated from the n-FET area by the shallow STI (SSTI) and further electrical isolation is properly provided by the deep STIs (DSTI). After formation of the STIs is completed, p-channel FETs may be formed in the p-FET area and n-channel FETs may be formed in the n-FET area.

As a result, a method of manufacturing a semiconductor device comprising an STI is provided wherein a dual STI formation process is performed. A relatively deep trench is formed that is partially filled with a flowable dielectric material and with a non-flowable oxide material atop of the flowable oxide material. Moreover, a relatively shallow STI is formed that is filled with the flowable dielectric material in a first stage and, after removal of that flowable dielectric material, filled with the non-flowable oxide material in a second stage. After filling the trenches with the flowable dielectric material, steam anneal is performed. During the steam anneal, a liner formed at walls of the trenches covers and protects a semiconductor layer and an SiGe region thereof. Consequently, the semiconductor layer and the SiGe region that will serve as channel regions of FETs that subsequently have to be formed are protected against the steam anneal and, therefore, are superior to channel regions of the art that are affected by steam anneal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a trench isolation of a semiconductor device, comprising:
   providing a silicon-on-insulator (SOI) substrate comprising a semiconductor bulk substrate, a buried oxide layer formed on said semiconductor bulk substrate and a semiconductor layer formed on said buried oxide layer;
   forming a trench through said semiconductor layer and extending at least partially into said buried oxide layer;
   forming a liner at sidewalls of said trench;
   deepening said trench into said semiconductor bulk substrate;
   filling said deepened trench with a flowable dielectric material;
   performing an anneal of said flowable dielectric material;
   removing a portion of said annealed flowable dielectric material from an upper portion of said deepened trench; and
   filling said upper portion of said deepened trench with an oxide material.

2. The method of claim 1, further comprising removing said liner after performing said anneal, after removing said portion of said annealed flowable dielectric material, and before filling said upper portion of said deepened trench with said oxide material.

3. The method of claim 1, wherein said liner is made of a silicon-nitride material or comprises a silicon-nitride material.

4. The method of claim 1, wherein said semiconductor layer comprises an SiGe region and said liner is formed on a side surface of said SiGe region before said anneal.

5. The method of claim 1, wherein said semiconductor layer comprises an SiGe region and further comprising forming another trench extending at least partially into said buried oxide layer with a smaller depth than a depth of said deepened trench and forming a liner at sidewalls of said another trench such that a side surface of said SiGe region is covered before said anneal.

6. The method of claim 1, wherein said liner is formed prior to deepening said trench.

7. The method of claim 1, further comprising filling said trench with a mask material prior to deepening said trench.

8. A method of manufacturing a trench isolation of a semiconductor device, comprising:
   providing a silicon-on-insulator (SOI) substrate comprising a semiconductor bulk substrate, a buried oxide layer formed on said semiconductor bulk substrate and a semiconductor layer formed on said buried oxide layer;
   forming a trench through said semiconductor layer and extending at least partially into said buried oxide layer;
   deepening said trench into said semiconductor bulk substrate;
   after deepening said trench, forming a liner at sidewalls of said deepened trench;
   filling said deepened trench with a flowable dielectric material;
   performing an anneal of said flowable dielectric material;
   removing a portion of said annealed flowable dielectric material from an upper portion of said deepened trench; and
   filling said upper portion of said deepened trench with an oxide material.

9. The method of claim 8, further comprising removing an upper portion of said liner after performing said anneal, after removing said portion of said annealed flowable dielectric material, and before filling said upper portion of said deepened trench with said oxide material.

10. The method of claim 8, wherein said liner is made of a nitride material or comprises a nitride material.

11. The method of claim 8, wherein said semiconductor layer comprises an SiGe region and said liner is formed on a side surface of said SiGe region before said anneal.

12. The method of claim 8, wherein said semiconductor layer comprises an SiGe region and further comprising forming another trench extending at least partially into said buried oxide layer with a smaller depth than a depth of said deepened trench and forming a liner at sidewalls of said another trench such that a side surface of said SiGe region is covered before said anneal.

13. The method of claim 8, further comprising filling said trench with a mask material prior to deepening said trench.

14. A method of manufacturing a semiconductor device, comprising:
   providing a silicon-on-insulator (SOI) substrate comprising a semiconductor bulk substrate, a buried oxide layer formed on said semiconductor bulk substrate and a semiconductor layer formed on said buried oxide layer, wherein said semiconductor layer comprises an SiGe region;
   forming a first trench through said semiconductor layer and extending at least partially into said buried oxide layer;
   forming a second trench spaced apart from said first trench through said semiconductor layer and extending at least partially into said buried oxide layer such that one sidewall of said second trench exposes a side surface of said SiGe region;
   forming a first liner at sidewalls of said first trench and a second liner at sidewalls of said second trench;
   deepening said first trench into said semiconductor bulk substrate without deepening said second trench;
   filling said deepened first trench and said second trench with a flowable dielectric material;
   performing an anneal of said flowable dielectric material; and
   forming an n-channel transistor and a p-channel transistor separated from each other by said second trench and wherein said SiGe region provides a channel region of said p-channel transistor.

15. The method of claim 14, further comprising:
   removing a portion of said annealed flowable dielectric material from an upper portion of said deepened first trench;
   removing said annealed flowable dielectric material from said second trench; and
   subsequently filling said upper portion of said deepened first trench and said second trench with an oxide material.

16. The method of claim 15, further comprising:
   removing said first liner after performing said anneal, after removing said portion of said annealed flowable dielectric material from said upper portion of said deepened first trench, and before filling said upper portion of said deepened first trench with said oxide material; and removing said second liner after performing said anneal, after removing said annealed flowable dielectric material from said second trench, and before filling said second trench with said oxide material.

17. The method of claim 14, wherein at least one of said first and second liners is made of a nitride material or comprises a nitride material.

18. The method of claim 14, wherein said first and second liners are formed prior to deepening said first trench.

19. The method of claim 14, wherein said first and second liners are formed after deepening said first trench.

20. The method of claim 14, further comprising filling at least said first trench with a mask material prior to deepening said first trench.

\* \* \* \* \*